(12) United States Patent
Chen et al.

(10) Patent No.: US 6,208,699 B1
(45) Date of Patent: Mar. 27, 2001

(54) METHOD AND APPARATUS FOR DETECTING ZERO RATE FRAMES IN A COMMUNICATIONS SYSTEM

(75) Inventors: Tao Chen; Shimman Patel, both of San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 09/388,029

(22) Filed: Sep. 1, 1999

(51) Int. Cl.[7] .............................. H04L 27/06; H04L 27/20
(52) U.S. Cl. ...................... 375/340; 375/225; 375/341; 375/349; 714/704; 714/758; 714/796
(58) Field of Search ...................... 375/140, 147, 375/224, 225, 262, 265, 316, 324, 340, 341, 349; 704/236, 242, 243, 244; 714/704, 708, 758–760, 794–796

(56) References Cited

U.S. PATENT DOCUMENTS

| | | | |
|---|---|---|---|
| 5,502,713 | * | 3/1996 | Lagerqvist et al. .................. 370/252 |
| 5,671,255 | * | 9/1997 | Wang et al. .......................... 375/341 |
| 5,710,784 | * | 1/1998 | Kindred et al. ...................... 375/262 |
| 5,771,461 | * | 6/1998 | Love et al. ............................ 455/522 |
| 5,774,496 | * | 6/1998 | Butler et al. ......................... 375/225 |
| 6,058,107 | * | 5/2000 | Love et al. ............................ 370/332 |
| 6,075,815 | * | 6/2000 | Chheda et al. ....................... 375/227 |
| 6,092,230 | * | 7/2000 | Wood et al. .......................... 714/755 |
| 6,097,772 | * | 6/2000 | Johnson et al. ...................... 375/346 |

* cited by examiner

Primary Examiner—Young T. Tse
(74) Attorney, Agent, or Firm—Philip R. Wadsworth; Thomas R. Rouse (57) ABSTRACT

Techniques for detecting zero rate frames in a received data transmission. A modulated signal is received and demodulated in accordance with a particular demodulation format to generate demodulated symbols. The demodulated symbols are partitioned into a number of received frames. For each received frame, a quality metric is computed and compared against a threshold value. The threshold value is selected based, in part, on the quality metrics of received frames. Based on the comparison result, the received frame is indicated as being either transmitted and received in error (i.e., erased or bad) or not transmitted at all (i.e., zero rate or empty). The quality metric can relate to an energy of a received frame, a distance between a received frame and a codeword corresponding to the received frame, or other metrics. The threshold value can be selected based on the quality metrics computed for decoded frames or received frames identified as good, and can be dynamically adjusted based on current information available at the receiver. The method is advantageously used in a CDMA communications system.

28 Claims, 5 Drawing Sheets

METHOD AND APPARATUS FOR DETECTING ZERO RATE FRAMES IN A COMMUNICATIONS SYSTEM

BACKGROUND OF THE INVENTION

I. Field of the Invention

The present invention relates to data communications. More particularly, the present invention relates to novel and improved method and apparatus for detecting zero rate frames in a data transmission.

II. Description of the Related Art

Many modern day communications systems currently exist for transmitting data from a source device to a destination device. Among these systems, code division multiple access (CDMA) communications systems are efficient data transmission systems that employ spread spectrum techniques to utilize an entire available signal bandwidth. CDMA systems use other techniques to further enhance system capacity while providing the required level of performance. Such techniques include dynamic adjustment of the transmit power level and data transmission at a variable rate.

In CDMA systems, communication between users is conducted via one or more base stations. A first user on one mobile station communicates to a second user on a second mobile station by transmitting data on a reverse link to a base station. The base station receives the data and can route the data to another base station. The data is then transmitted on the forward link of the same base station, or a second base station, to the second mobile station. The forward link refers to transmission from the base station to the mobile station, and the reverse link refers to transmission from the mobile station to the base station.

Data transmissions for CDMA systems occur in frames of data. To enhance system capacity, the rate of each frame can be selected from one of a number of possible rates (e.g., full, half, quarter, and eight rates), depending on the amount of data to be transmitted. For some CDMA systems, transmission occurs in specified (e.g., 20 msec) time intervals, with each interval comprising a single larger (20 msec) frame or a number of smaller (5 msec) frames. Each frame can include a data transmission or no data transmission. A frame with no transmission is commonly referred to as a zero rate (or empty) frame.

The variable and zero rate frames allow the CDMA system to increase capacity by decreasing the transmit power level, and thus reducing interference, when smaller amounts or no data is present for transmission. At the receiving device, a detection scheme is necessary to detect whether a frame was received correctly (i.e., a good frame) or received in error (i.e., an erased or bad frame), or whether no transmission occurred (i.e., a zero rate or empty frame). This information may be required, for example, to adjust the transmit power level at the transmitting source to maintain a specified level of performance.

As can be seen, techniques that can accurately identify zero rate frames are highly desirable.

SUMMARY OF THE INVENTION

The present invention provides novel and improved techniques for detecting zero rate frames in a received data transmission. Zero rate detection can be achieved using various methods. Typically, a quality metric is computed for a received frame that cannot be reliably decoded and compared against a threshold value. Based on the comparison result, the received frame is indicated as being either transmitted and received in error (i.e., erased or bad) or not transmitted at all (i.e., zero rate or empty). In accordance with different aspects of the invention, the threshold value can be 1) selected based on the quality metrics computed for decoded frames, 2) selected based on the quality metrics computed for received frames identified as good, and 3) dynamically adjusted based on current information available at the receiver. These features increase accuracy in identifying zero rate frames by taking into account the operating conditions of the receiver.

An embodiment of the invention provides a method for identifying zero rate frames in a received data transmission. In accordance with the method, a modulated signal is received and demodulated in accordance with a particular demodulation format to generate demodulated symbols. The demodulated symbols are partitioned into a number of received frames. For each received frame, the symbols are decoded and certain decoding metrics (e.g., symbol error rate, CRC, and so on) are checked to determine the success of decoding. If decoding fails, or if a rate determination algorithm (RDA) needs to distinguish between zero rate and erased frames, a quality metric is computed and compared against a threshold value. The threshold value is selected based, in part, on the quality metrics of received frames. A particular received frame is identified as being a zero rate frame or not a zero rate frame based on the comparison. The method is advantageously used in a CDMA communications system.

The quality metric can relate to an energy of a received frame, a distance between a received frame and a codeword corresponding to the received frame, or other metrics. The energy can be computed as a sum of square symbols for the received frame. The distance can be computed by decoding a received frame, re-encoding the decoded data (if a non-systematic code is used at the transmitting device), and performing a dot product of the received frame with the decoded or re-encoded frame. The threshold value can be selected based, in part, on the computed quality metrics of decoded frames identified as good frames, and can also be dynamically adjusted.

Another embodiment of the invention provides a receiver subsystem in a communications system. The receiver subsystem includes a demodulator coupled to a data processor. The demodulator receives and demodulates a modulated signal in accordance with a particular demodulation format to generate demodulated symbols. The data processor is configured to: 1) partition the demodulated symbols into a number of received frames, 2) compute a quality metric for each received frame, 3) compare the quality metric for a particular received frame against a threshold value, and 4) identify the particular received frame as being a zero rate frame or not a zero rate frame based on the comparison. The threshold value is selected based, in part, on the quality metrics of received frames.

The data processor can include: 1) a decoder that receives and decodes the received frames to generate decoded frames, 2) a CRC circuit that receives and checks the decoded frames to identify good frames among the decoded frames, 3) an encoder that receives and re-encodes the decoded frames, or a combination thereof. The quality metric can relate to an energy, a distance, or other metrics of the received frame.

Yet another embodiment of the invention provides a receiver subsystem used in a CDMA communications system and operable to identify zero rate frames in a received data transmission. The receiver subsystem includes a demodulator, a decoder, a CRC circuit, and a metric calculation unit. The demodulator receives and demodulates a modulated signal in accordance with a particular demodulation format to generate demodulated symbols. The decoder receives the demodulated symbols as a plurality of received frames, and decodes the received frames into decoded frames. The CRC circuit receives and checks the decoded frames to identify good frames among the decoded frames. The metric calculation unit computes a quality metric for each of the plurality of received frames, compares the quality metric for a particular received frame against a threshold value, and identifies the particular received frame as being a zero rate frame or not a zero rate frame based on the comparison. The threshold value is selected based, in part, on the quality metrics of received frames.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1:
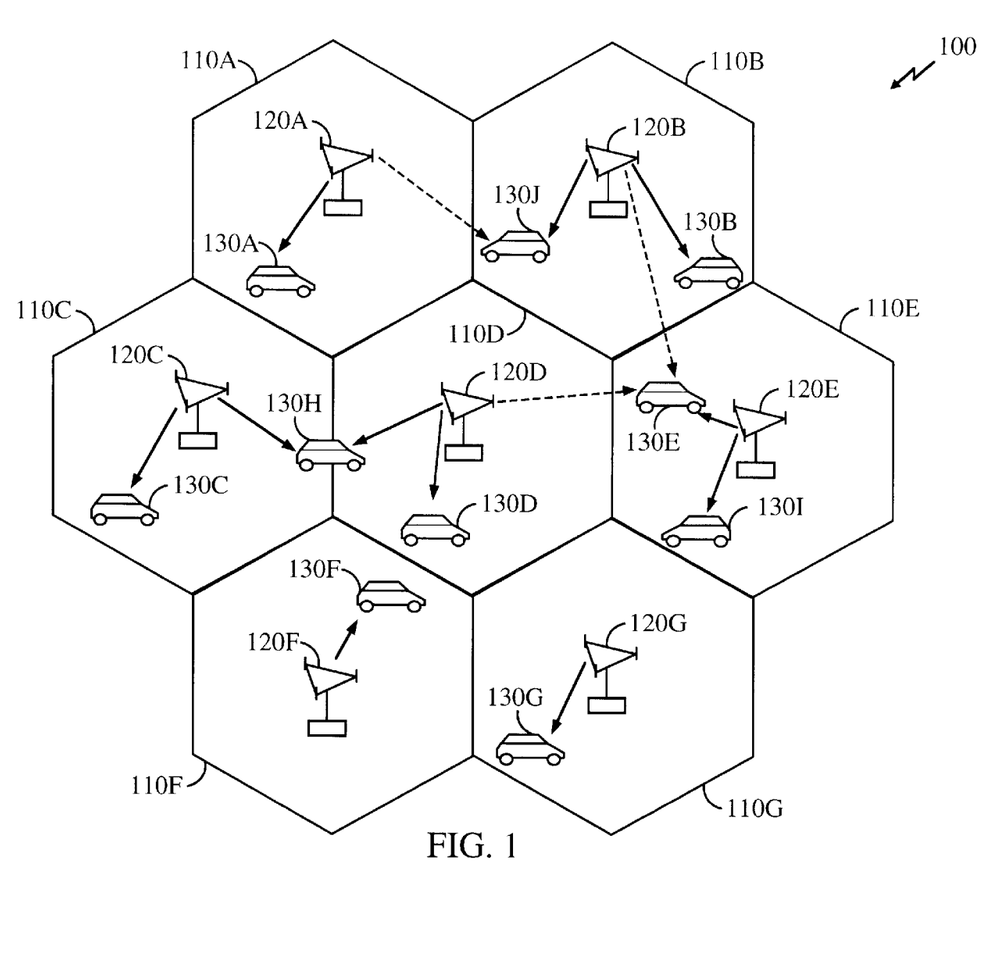
FIG. 1 shows a diagram of an embodiment of a communications system that comprises multiple cells.

FIG. 1 shows a diagram of an embodiment of a communications system 100 that comprises multiple cells 110A–110G. Each cell 110 is serviced by a corresponding base station 120. Various mobile stations 130 are dispersed throughout the communications system. In an embodiment, each mobile station 130 communicates with one or more base stations 120 on the forward and reverse links, depending on whether the mobile station is in soft handoff. In FIG. 1, the solid line with the arrow indicates a data transmission from a base station to a mobile station. A broken line with the arrow indicates that a mobile station is receiving the pilot signal, but no data transmission, from the base station. The reverse link communication is not shown in FIG. 1 for simplicity.

As shown by FIG. 1, each base station can transmit data to one or more mobile stations at any given moment. The mobile stations, especially those located near a cell boundary, can receive data transmission and pilot signals from multiple base stations. If the pilot signal of a particular base station is above a particular threshold, the mobile station can request that base station to be added to the active set of the mobile station. In an embodiment, each mobile station can receive data transmission from zero or more members of the active set.

The present invention can be applied to code division multiple access (CDMA) systems, time division multiple access (TDMA) systems, frequency division multiple access (FDMA) systems, and other communications systems. The International Telecommunications Union (ITU) recently requested the submission of proposed methods for providing high rate data and high-quality speech services over wireless communication channels. The majority of the proposals operate within a code division multiple access environment. For clarity, the present invention is described in terms of the submission by the Telecommunications Industry Association (TIA) entitled "The cdma2000 ITU-R RTT Candidate Submission," herein after referred to as IS-2000. However, the teachings of the present invention are equally well suited to application to other CDMA standards proposed to the ITU. One of the proposals was issued by the European Telecommunications Standards Institute (ETSI), entitled "The ETSI UMTS Terrestrial Radio Access (UTRA) ITU-R RTT Candidate Submission," hereafter referred to as WCDMA. The contents of these submissions are public record and are well known in the art.

Figure 2:
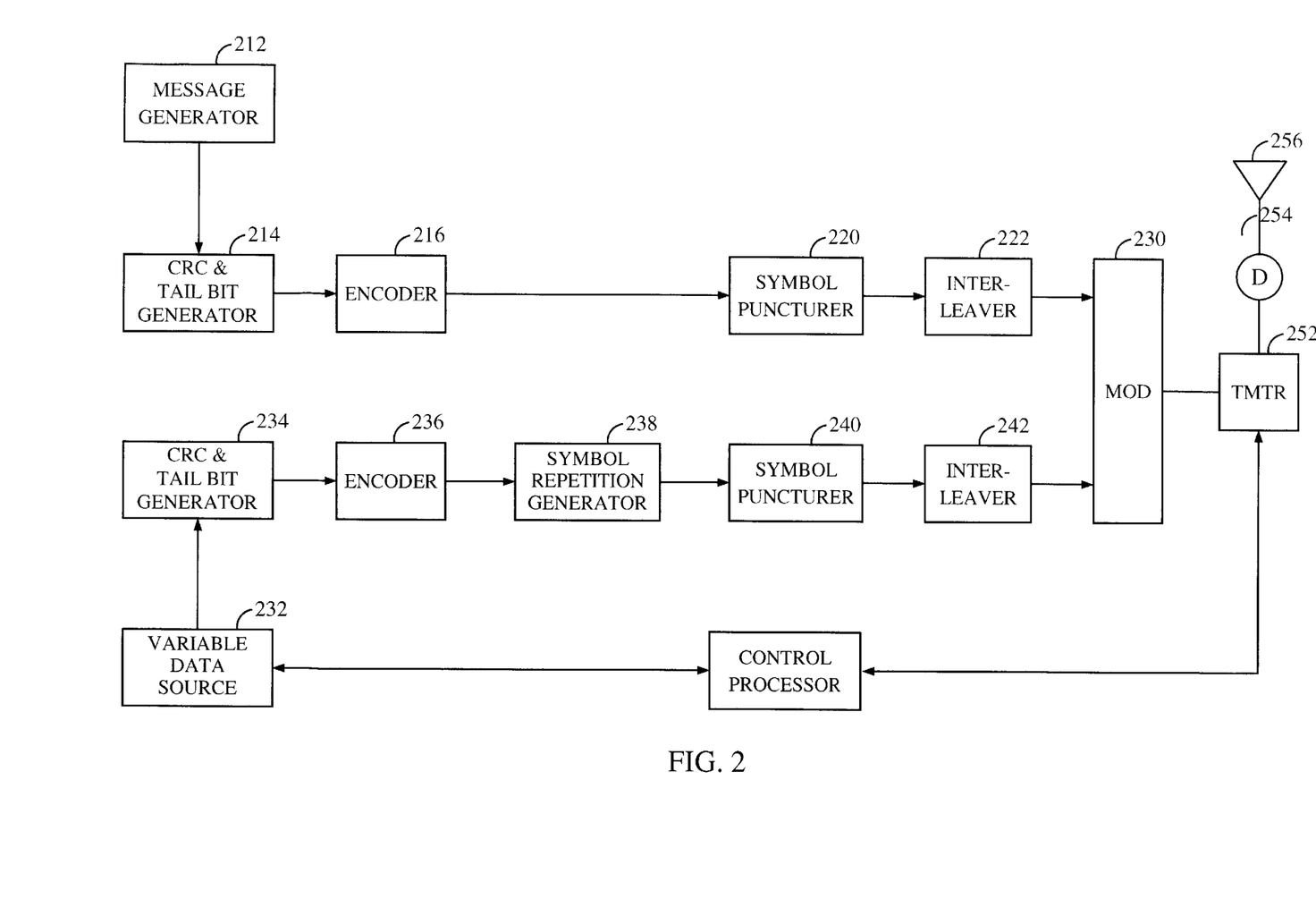
FIG. 2 shows a block diagram of an embodiment of a portion of a base station for generating a fundamental channel and a control channel for the forward link transmission.

FIG. 2 shows a block diagram of an embodiment of a portion of the base station for generating a fundamental channel and a control channel for the forward link transmission. The fundamental channel can be used to send primary data from the base station to the mobile station. In the case of speech transmissions, the fundamental channel carries speech data. The control channel carries control data such as status and signaling information to the mobile station. For clarity, the invention is described for forward link transmissions from the base station to the mobile station, but is equally applicable for reverse link transmissions from the mobile station to the base station.

As shown in FIG. 2, a message generator 212 generates and provides control messages to a cyclic redundancy check (CRC) and tail bit generator 214. Generator 214 appends a set of CRC bits used to check the accuracy of the decoding at the mobile station. The CRC bits are parity bits generated based on the contents of the particular control message. Generator 214 further appends a set of tail bits to the control message to clear the memory of the decoder at the mobile station. The formatted control message is then provided to an encoder 216 that encodes the message with a particular encoding format. Encoder 216 provides forward error correction (FEC) coding of the control message. In a specific embodiment, encoder 216 is a rate one-half or a rate one-quarter convolutional encoder, as defined by the IS-2000 submission. The encoded symbols from encoder 216 are provided to a symbol puncturer 220 that punctures, or removes, some of the symbols in accordance with a particular puncturing pattern. The unpunctured symbols are provided to an interleaver 222 that reorders the symbols in accordance with a particular interleaving format. The interleaved symbols are provided to a modulator 230.

A variable rate data source 232 generates variable rate data. The data can comprise speech, video, facsimile, multimedia, electronic mail messages, and other forms of digital data. An example of a method for transmitting data in code channel frames of fixed duration is described in U.S. Pat. No. 5,504,773, entitled "METHOD AND APPARATUS FOR THE FORMATTING OF DATA FOR TRANSMISSION," assigned to the assignee of the present invention, and incorporated herein by reference. Generally, variable rate data source 232 can support any number of rates, and can also support zero rate for no data transmission.

In a specific embodiment, variable rate data source 232 is a variable rate speech encoder such as the one described in U.S. Pat. No. 5,414,796, entitled "VARIABLE RATE VOCODER," assigned to the assignee of the present invention, and incorporated herein by reference. Variable rate speech encoders are popular in wireless communications because their use increases the battery life of wireless communication devices and enhances system capacity with minimal impact on perceived speech quality. The Telecommunications Industry Association has codified some popular variable rate speech encoders in such standards as Interim Standard IS-96 and Interim Standard IS-733. These variable rate speech encoders encode the speech signal at four possible rates based on the level of voice activity. These rates are referred to as full rate, half rate, quarter rate, and eighth rate. Each rate is associated with a particular number of bits used to encode a frame of speech, with the full, half, quarter, and eight rates respectively using one, one-half, one-quarter, and one-eight a specified maximum number of bits to encode the frame. The rate can vary on a frame-by-frame basis.

Variable rate date source 232 provides the data, in frames, to a CRC and tail bit generator 234. Generator 234 appends a set of CRC bits used to check the accuracy of the decoding at the mobile station. Again, the CRC bits are parity bits generated based on the contents of the particular data frame. Generator 234 also appends a set of tail bits to the data frame to clear the memory of the decoder at the mobile station. The formatted frame is then provided to an encoder 236 that encodes the frame with a particular encoding format. Encoder 236 provides forward error correction coding of the data. In a specific embodiment, encoder 236 is a convolutional or a turbo encoder operated at either rate one-half or rate one-quarter, as defined by the IS-2000 submission. The encoded symbols from encoder 236 are provided to a symbol repetition generator 238 that repeats the encoded symbols of lower rate frames. The symbols are then provided to a puncturing element 240 that punctures some of the symbols in accordance with a particular puncturing pattern to provide a particular number of symbols for each frame. The unpunctured symbols are provided to an interleaver 242 that reorders the symbols in accordance with a particular interleaving format. The interleaved symbols are provided to modulator 230.

In an embodiment, modulator 230 modulates the fundamental and control channels in accordance with a particular CDMA modulation format and provides a modulated signal to a transmitter (TMTR) 252. For example, modulator 230 can scramble the data with a long PN sequence, spectrally spread the data with short PN sequences, cover the data with Walsh codes, and quadrature modulates the data with an inphase and a quadrature carrier signal. Transmitter 252 amplifies, filters, and upconverts the signal. The forward link signal is then provided through a duplexer 254 and transmitted from an antenna 256. The elements shown in FIG. 2 are described in further detail in the IS-2000.

FIG. 2 shows a simplified block diagram of the fundamental and control channels. Other channels are also available for data transmission on the forward link but not shown in FIG. 2 for simplicity.

Figure 3:
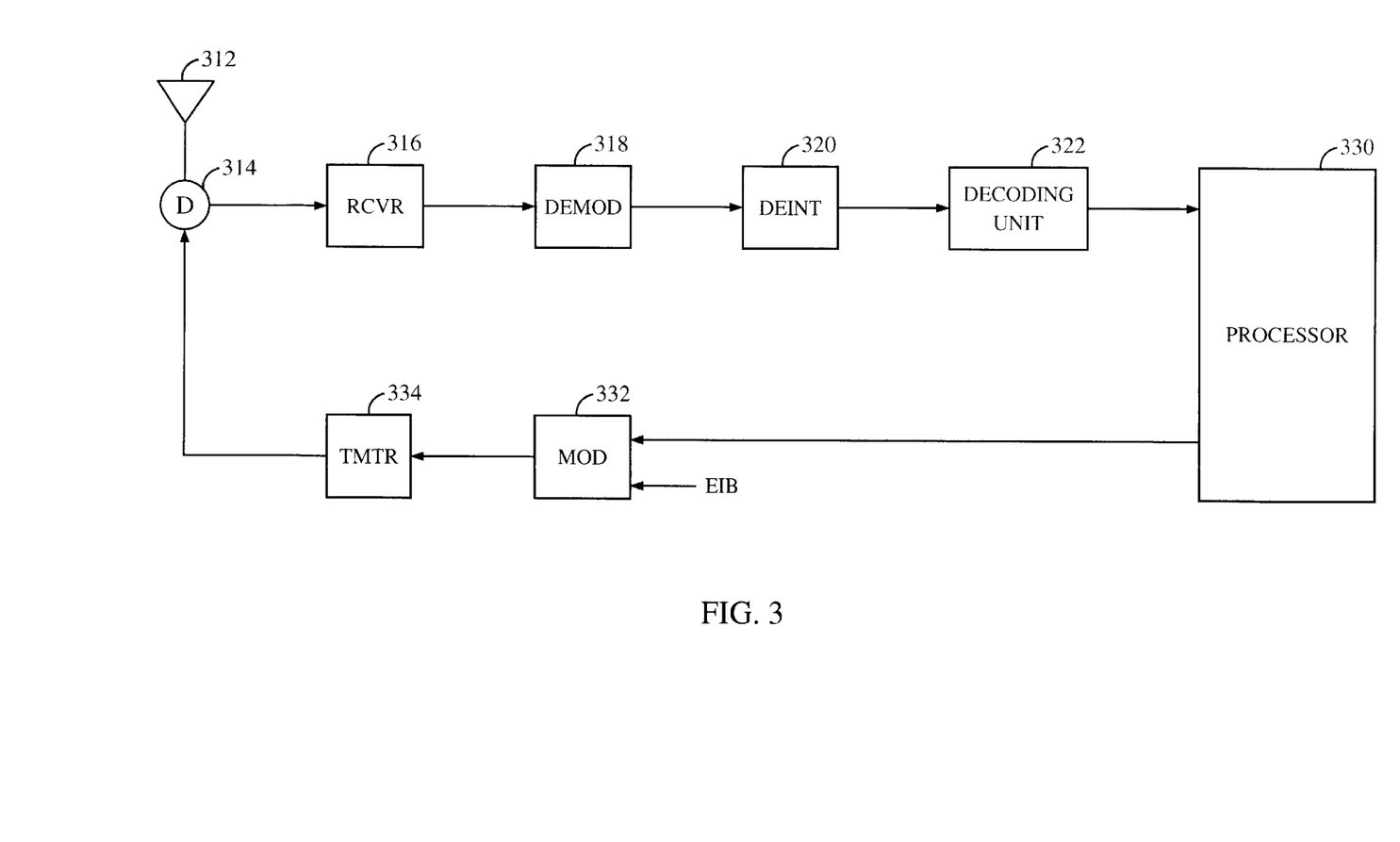
FIG. 3 shows a block diagram of an embodiment of a portion of a mobile station for processing the fundamental and control channels received on the forward link transmission.

FIG. 3 shows a block diagram of an embodiment of a portion of the mobile station for processing the fundamental and control channels received on the forward link. The forward link signal from the base station is received by an antenna 312, routed through a duplexer 314, and provided to a receiver (RCVR) 316. Receiver 316 downconverts the received signal to a baseband frequency in accordance with a demodulation format that is complementary to the modulation format (e.g., QPSK) used at the base station. The baseband signal is then provided to, and demodulated by, a demodulator (DEMOD) 318 to provide demodulated symbols. Demodulator 318 performs functions complementary to those performed at the base station (e.g., decovering, despreading, and descrambling). The demodulated symbols are provided to a de-interleaver (DEINT) 320 that reorders the symbols in accordance with a de-interleaving format that is complementary to the interleaving format used at the base station. The reordered symbols are provided to a decoding unit 322 that decodes the symbols to provide an estimate of the transmitted frame. Using the CRC bits, if any, included in the transmitted frame, the estimate of the transmitted frame is then checked to determine the accuracy of the frame estimate. The decoded data is provided to a processor 330.

In an embodiment, the mobile station performs a blind decoding on the forward link signal. Blind decoding describes a method of decoding variable rate data in which the receiver does not know a priori the rate of the data transmission. In an embodiment, the mobile station deinterleaves, accumulates, and decodes the data in accordance with each possible rate hypothesis (e.g., full, half, quarter, eight, and zero rates and erasure). One of the decoded frames is selected as the best estimate based on one or more quality metrics such as the symbol error rate, the CRC check, the Yamamoto metric, the frame energy, and other metrics.

FIG. 3 also shows some of the circuit elements used to transmit erasure indicator bits (EIBs) to the base station for forward link power control. In an embodiment, the EIBs are multiplexed with the reverse traffic data and provided to a modulator (MOD) 332 that combines the EIBs with the traffic data at particular locations defined by the IS-2000 submission. The combined EIBs and traffic data are modulated by modulator 332 using a particular modulation format. The modulated data is provided to a transmitter (TMTR) 334 that upconverts, amplifies, and filters the signal prior to transmission to the base station via antenna 312. In an embodiment, the reverse link signal is a CDMA signal that is modulated in accordance with the IS-2000 submission.

To enhance system capacity, the CDMA system is designed to transmit data using frames of various frame formats and rates. Each frame format can be defined by a particular frame length, a particular coding format, and (possibly) some other attributes. For example, in accordance with the IS-2000 submission, data is transmitted in 5 msec or 20·L msec frames, where L is 1, 2, or 4. The rate of each 20·L msec frame can also be selected from one of a number of possible rates (e.g., eight or more rates), depending on the amount of data to be transmitted and other considerations. For an IS-2000 compliant system, transmission occurs in 20 msec intervals, with each interval comprising one 20 msec frame, four 5 msec frames, or a portion of a longer frame. Each frame can include a data transmission or no transmission. The 5 msec frame has less processing delay, and is particularly useful for transmitting control messages that need to be acted on quickly. As currently specified by the IS-2000 submission, a zero rate frame can be transmitted on a 5 msec frame or a 20 msec frame on the dedicated control channel (e.g., when there are no control messages to send), and a zero rate frame may be transmitted on the fundamental channel when the transmitter is out of power. A zero rate frame may also be transmitted on a particular (e.g., supplemental) channel if there is no information (e.g., no voice data) to send.

Figure 4:
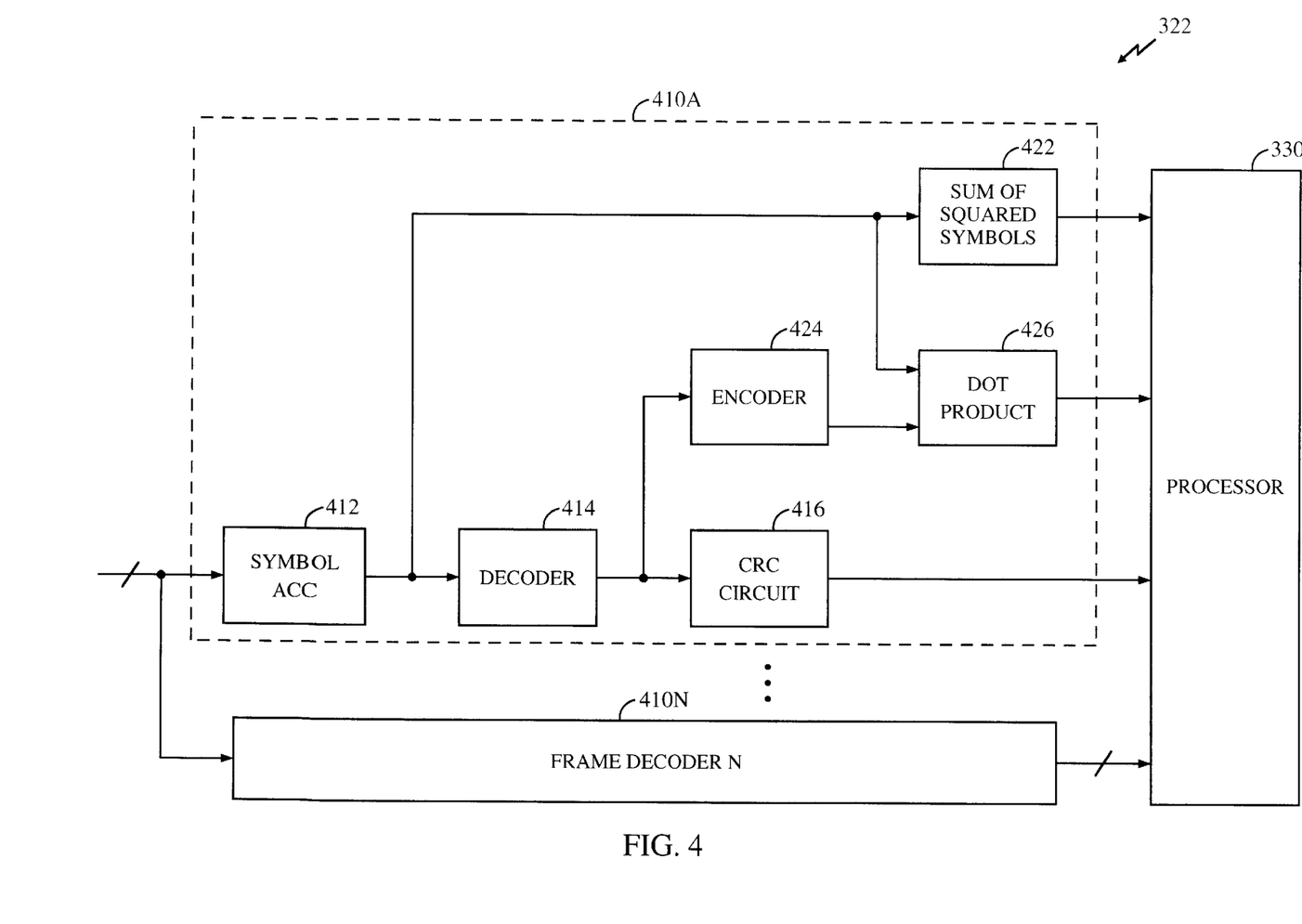
FIG. 4 shows a block diagram of an embodiment of a decoding unit within the mobile station.

FIG. 4 shows a block diagram of an embodiment of decoding unit 322. The demodulated data from de-interleaver 320 is provided to a number of frame decoders 410A through 410N. Each frame decoder 410 can be used to decode a data frame based on a particular decoding hypothesis (i.e., a particular frame format and rate). A data processor can be designed to include all elements, additional elements, and/or a subset of the elements in frame decoder 410.

On the forward link, data transmission at lower rates is achieved by repeating each code symbol N times (where N is 1, 2, 4, or 8) to achieve a particular symbol rate. Each transmitted symbol is also scaled by 1/N to provide approximately the same amount of energy per code symbol. At the receiver, each set of N repeated symbols are accumulated and scaled to provide a combined soft decision symbol that is representative of the original code symbol.

Within each frame decoder 410, the demodulated data is provided to a symbol accumulator 412 that accumulates sets of N received symbols based on a hypothesized rate of 1/N. For example, if the frame decoder is configured to decode an eight rate frame, symbol accumulator 412 accumulates sets of eight received symbols to generate a soft decision symbol for each set. Each soft decision symbol is representative of the original symbol at the transmitting device. The soft decision symbols are provided to a decoder 414 that decodes the symbols to provide decoded data. Decoder 414 is designed based on the encoder used at the transmitting source. For example, a Viterbi decoder is preferably used to decode convolutionally encoded data. Decoder 414 or other external circuits may further be designed to provide a frame quality metric such as a symbol error rate, a CRC check, a Yamamoto quality metric, or a combination thereof, that can be used to determine the quality of the decoded frame. The Yamamoto quality metric is particularly useful for lower rates when CRC bits are not available.

An efficient decoding scheme for data is disclosed in U.S. Pat. No. 5,933,462, entitled "SOFT DECISION OUTPUT DECODER FOR DECODING CONVOLUTIONALLY ENCODED CODEWORDS," and U.S. Pat. No. 5,710,784, entitled "MULTIRATE SERIAL VITERBI DECODER FOR CODE DIVISION MULTIPLE ACCESS SYSTEMS APPLICATIONS," both assigned to the assignee of the present invention, and incorporated herein by reference.

For some rate hypotheses that include CRC bits, the decoded data is provided to a CRC circuit 416 that checks the CRC bits appended with each decoded frame. CRC check is known in the art and further defined by the particular CDMA standard being implemented (e.g., IS-95-A or IS-2000). In an embodiment, CRC circuit 416 provides a one-bit result for each checked frame. In a specific implementation, the CRC result is a logic zero ("0") if the CRC check indicates a good frame and a logic one ("1") if the CRC check indicates a frame that is not good (i.e., erased or empty).

Decoding unit 322 can be designed in various configurations. For example, for an IS-2000 compliant system, decoding unit 322 can include a number of frame decoders 410 operated in parallel, with each frame decoder 410 configured to decode a particular decoding hypothesis. The rate determination can be performed based on the symbol error rate, the CRC result, the Yamamoto quality metrics, other metrics, or a combination thereof. One such decoder design is disclosed in U.S. Pat. No. 5,774,496, entitled "METHOD AND APPARATUS FOR DETERMINING DATA RATE OF TRANSMITTED VARIABLE RATE DATA IN A COMMUNICATIONS RECEIVER," assigned to assigned to the assignee of the present invention, and incorporated herein by reference.

In FIG. 4, for ease of understanding, decoding unit 322 is shown as having multiple parallel paths for processing the demodulated symbols. However, a single decoding path using shared circuit elements is preferred in some implementations to reduce the amount of required circuitry. In the shared decoder implementations, the demodulated symbols are stored in a buffer (not shown in FIG. 4) as they are received and repeatedly provided to a frame decoder for decoding. The frame decoder is reconfigured for a different decoding hypothesis for each pass of the data. Other implementations of decoding unit 322 can be contemplated and are within the scope of the invention.

Detection of a zero rate frame may be required for many applications. In an IS-2000 system, a power control mechanism is provided to adjust the transmit power of the forward link signal based on the decoded forward link frames at the mobile station. The mobile station decodes the forward link frames and determines whether the frames are good, erased, or not transmitted. The base station is instructed to adjust the forward link transmit power level based on the decoded frames. For example, the base station can be instructed to decrease its transmit power to the mobile station if a decoded frame is good, increase the transmit power if the decoded frame is bad (or erased), and do nothing if no transmission (or zero rate) is detected. The quality of the communication and the capacity of the system are dependent, in part, on the ability to accurately detect erased and zero rate frames.

IS-2000 defines a power control mechanism for the forward link. Specifically, when operating in certain specified modes, the mobile station is required to set all power control bits on a Reverse Power Control Subchannel during a 20 msec period to an EIB, which is defined by the following:

1) The EIB bit is set to "0" in the second transmitted frame following the detection of a good 20 msec frame on the Forward Fundamental Channel or the Forward Dedicated Control Channel.

2) The EIB is set to "0" in the second transmitted frame following the detection of at least one good 5 msec frame without detection of any bad (i.e., erased) 5 msec frame.

3) The EIB is set to "1" in the second transmitted frame for all other cases.

The IS-2000 specification is tabulated in Table 1 for various decoding scenarios.

TABLE 1

| | Decoder and Zero Rate Detector Output | | | | | |
|---|---|---|---|---|---|---|
| Scenario | $1^{ST}$ 5 msec | $2^{ND}$ 5 msec | $3^{RD}$ 5 msec | $4^{TH}$ 5 msec | 20 msec | EIB |
| 1 | Bad | Bad | Bad | Bad | Good | 0 |
| 2 | Good | Empty | Empty | Empty | Bad/Empty | 0 |
| 3 | Empty | Good | Empty | Empty | Bad/Empty | 0 |
| 4 | Empty | Empty | Good | Empty | Bad/Empty | 0 |
| 5 | Empty | Empty | Empty | Good | Bad/Empty | 0 |
| 6 | Good | Good | Empty | Empty | Bad/Empty | 0 |
| 7 | Good | Empty | Good | Empty | Bad/Empty | 0 |
| 8 | Good | Empty | Empty | Good | Bad/Empty | 0 |
| 9 | Empty | Good | Good | Empty | Bad/Empty | 0 |
| 10 | Empty | Good | Empty | Good | Bad/Empty | 0 |
| 11 | Empty | Empty | Good | Good | Bad/Empty | 0 |
| 12 | Good | Good | Good | Empty | Bad/Empty | 0 |
| 13 | Good | Good | Empty | Good | Bad/Empty | 0 |
| 14 | Good | Empty | Good | Good | Bad/Empty | 0 |
| 15 | Empty | Good | Good | Good | Bad/Empty | 0 |

TABLE 1-continued

Decoder and Zero Rate Detector Output

| Scenario | 1ST 5 msec | 2ND 5 msec | 3RD 5 msec | 4TH 5 msec | 20 msec | EIB |
|---|---|---|---|---|---|---|
| 16 | Good | Good | Good | Good | Bad/Empty | 0 |
| 17 | Bad 5 msec frame(s) anywhere | | | | Bad/Empty | 1 |
| 18 | Empty | Empty | Empty | Empty | Empty | 1 |

As shown in Table 1, the EIB is set to logic low if: 1) the received 20 msec frame is decoded as a good frame, or 2) at least one received 5 msec frame within a 20 msec time interval is decoded as a good frame AND a bad (i.e., erased) frame is not detected. A frame can be identified as being good by performing a CRC check on the decoded frame. For the second case in which at least one 5 msec frame is detected as being good, the remaining 5 msec frames in the 20 msec time interval need to be identified as being either bad or empty. Zero rate detection is thus needed for this case.

Referring to Table 1, when the EIB is set to zero, the decoder has information from at least one good frame. In accordance with an aspect of the invention, for improved detection accuracy, the information from good frames can be used to assist in determining whether a decoded frame is bad or empty.

Zero rate detection can be achieved using various methods. Generally, a quality metric is computed for a received frame and compared against a threshold value. Based on the comparison result, the received frame is indicated as being either transmitted and received in error (i.e., erased or bad) or not transmitted at all (i.e., zero rate or empty). In accordance with an aspect of the invention, the threshold value can be selected based on the quality metrics computed for received (and possibly decoded) frames. In accordance with another aspect of the invention, the threshold value can be selected based on the quality metrics computed for received frames identified as good. In accordance with yet another aspect of the invention, the threshold value can be dynamically adjusted based on current information (or future information, if the current decision is delayed) available at the receiver. These features increase accuracy in identifying zero rate frames by taking into account the operating conditions of the receiver.

In one zero rate detection method, the sum of the squared symbols is computed and compared against a threshold value. The sum of the squared symbols is indicative of the energy of the received frame. A data transmission is indicated if the computed energy is greater than an energy threshold value, and no transmission is indicated if the computed energy is less than the threshold value.

FIG. 4 shows a block diagram of the circuitry used to detect zero rate using the sum of the squared symbols. The soft decision symbols from symbol accumulator 412 are provided to a sum of squared symbols element 422. Element 422 squares each received soft decision symbol in a particular frame and sums the squared symbols within the frame. The sum result represents the computed energy for the frame and is provided to processor 330. In an embodiment, processor 330 considers two hypotheses for the computed energy value, which are:

$H_0$—the computed energy contains only noise, and $H_1$—the computed energy contains signal plus noise.

Specifically, processor 330 determines whether the computed energy is likely to contain only noise (i.e., hypothesis $H_0$) or signal plus noise (i.e., hypothesis $H_1$). Based on the result of this determination, a received frame is indicated as being erased or zero rate. The zero rate determination is described in more detail below.

The computation of the noise and the signal plus noise of a particular communications channel is described in further detail in U.S. Pat. No. 5,903,554, entitled "METHOD AND APPARATUS FOR MEASURING LINK QUALITY IN A SPREAD SPECTRUM COMMUNICATION SYSTEM," assigned to the assignee of the invention, and incorporated herein by reference.

In a second zero rate detection method, the decoded symbols are re-encoded and correlated with the soft decision symbols. For a particular frame, a dot product is performed between the (encoded) soft decision symbols and the re-encoded symbols. The dot product is indicative of a distance between the received vector (i.e., the received frame) and its nearest codeword (i.e., the re-encoded frame). The computed distance is compared against a distance threshold. A data transmission is indicated if the computed distance is less than a distance threshold value, and no transmission is indicated if the computed distance is greater than the threshold value.

FIG. 4 also shows a block diagram of the circuitry used to detect zero rate using the computed distance. The decoded bits from decoder 414 are provided to an encoder 424 that encodes the bits using the same encoding format used at the transmitting source for the particular decoding hypothesis. For example, encoder 424 can be a convolutional or turbo encoder and can be a rate one-half or rate one-quarter encoder, as defined by the IS-2000 submission. The code symbols from encoder 424 are provided to a dot product element 426 that also receives the soft decision symbols from symbol accumulator 412. Dot product element 426 performs a dot product of the soft decision symbols with the re-encoded symbols in a manner known in the art, and provides the result to processor 330. The dot product result is indicative of the distance between the received and re-encoded frame. Processor 330 then considers the two hypotheses (described above) for the computed distance.

In a third method for zero rate detection, which is a variation of the second method, the decoded data bits are correlated with the soft decision symbols. For a systematic code, the encoded data includes the original data and coded (or parity) data. This property allows the decoded data bits to be correlated with the data portion of the encoded data (i.e., the soft decision symbols). This method eliminates the need for re-encoding, which simplifies the decoding circuitry and shortens the processing time to detect zero rate frame. This method is especially applicable to an IS-2000 compliant system, which employs a systematic turbo code for the supplemental channel on the forward link.

In the description above, the quality metrics are computed for each received frame. However, the quality metric can be computed for a fraction of a frame or for multiple frames, and this is within the scope of the invention.

For many CDMA systems, a pilot signal is transmitted on the forward or reverse link to allow the receiving station to perform various functions. As part of the signal processing, the pilot signal is recovered and used to coherently demodulate the forward link signal. Thus, the demodulated symbol includes a factor that is related to the pilot energy.

FIG. 4 includes circuitry used to compute several quality metrics (e.g., energy and distance) for identifying zero rate frames. Typically, only one quality metric is computed, and the frame decoder in FIG. 4 can be simplified. The quality metrics can also be computed in various manners such as by hardware specifically designed to perform the functions described herein, by software programmed to perform the described functions, or a combination of both. For example, sum or squared symbols element 422 can be implemented by software executed on processor 330. Processor 330 can be implemented in a microcontroller, a microprocessor, a digital signal processing (DSP) chip, or an application specific integrated circuit (ASIC) programmed to perform the function as described herein.

As noted above, the computed quality metric for a particular frame is compared against a threshold value to determine whether a zero rate or erased frame was received. The quality metric can be the energy computed using the first method, the distance computed using the second and third methods, or other metrics. The energy and distance metrics have an inverse relationship. Specifically, a zero rate frame is more likely if the computed energy is low or if the computed distance is large. For simplicity, the following description is directed toward the computed energy, but may be modified to cover the computed distance or other metrics.

Figure 5:
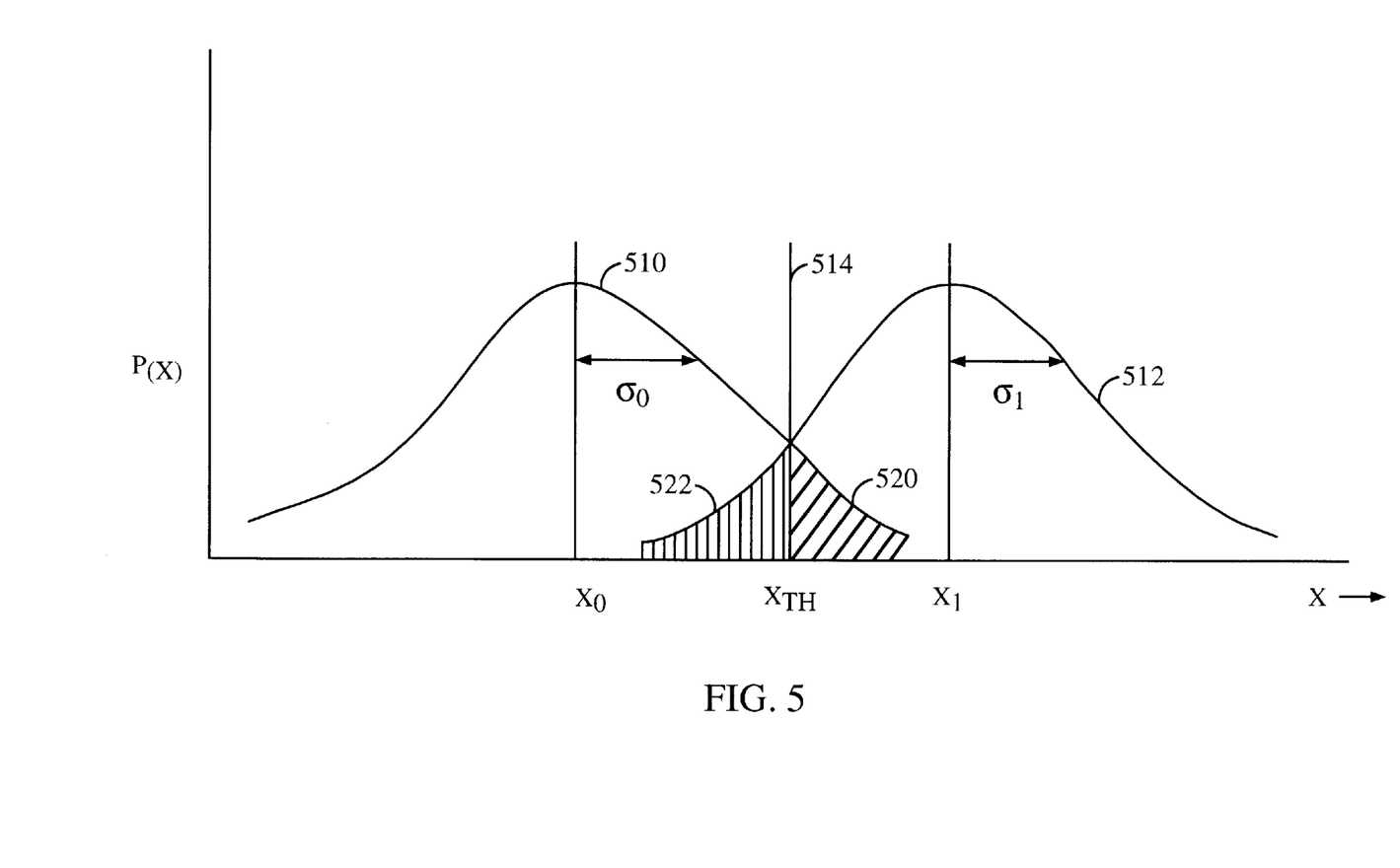
FIG. 5 is a plot showing two probability density functions (PDFs) for two hypotheses ($H_0$ and $H_1$) of a received data frame.

FIG. 5 is a plot showing two probability density functions (PDFs) for the two hypotheses ($H_0$ and $H_1$) of a received frame, which are identified above. A PDF 510 corresponds to hypothesis $H_0$ in which the computed energy contains predominantly noise, and a PDF 512 corresponds to hypothesis $H_1$ in which the computed energy contains signal plus noise. PDF 510 has a mean of $x_0$ and a standard deviation of $\sigma_0$, and PDF 512 has a mean of $x_1$ and a standard deviation of $\sigma_1$. The mean of PDF 510 is less than the mean of PDF 512, as expected. The distance between $x_1$ and $x_0$ corresponds to the mean signal energy of the received frames.

If PDFs 510 and 512 are known, a threshold 514 can be set at a value $x_{TH}$ such that a desired outcome is achieved. For example, if the desired outcome is to obtain the same likelihood of detection error for either hypothesis, then a threshold value $x_{TH1}$ can be selected such that an area 520 to the right of $x_{TH1}$ and under PDF 510 is equal to an area 522 to the left of $x_{TH1}$ and under PDF 512. If the threshold value is set lower than $x_{TH1}$, toward $x_0$, the probability of missing hypothesis $H_1$ is decreased but the probability of false detection for hypothesis $H_0$ is increased. That is, if the threshold value is set lower than $X_{TH1}$, a computed value belonging to hypothesis $H_1$ is more likely to be correctly identified but a computed value belonging to hypothesis $H_0$ is more likely to be incorrectly identified.

The desired outcome may be dependent on various considerations. For example, if the zero rate determination is used for controlling the transmit power of a transmitting source, it may be more desirable to err toward transmitting more power than necessary (which may reduce system capacity) than to transmit less power than required (which may degrade performance).

In an embodiment, PDF 510 is estimated from the computed metrics from empty frames and PDF 512 is estimated from the computed metrics from good and bad frames. As noted above, a frame can be identified as being correctly decoded (i.e., good) based on the result of the CRC check. Frames that do not pass the CRC check are identified as either bad or empty. In an embodiment, statistics such as the mean and standard deviation are computed or evaluated using nominal operation conditions. Subsequently, the statistics are computed using information from both good and bad frames as they occur in the actual operation. The mean and standard deviation can also be computed for the metrics associated with empty frames. Initially, statistics for empty frames can be estimated from the total noise power Nt on a known channel (e.g., the pilot channel). The estimation of Nt is disclosed in the aforementioned U.S. Pat. No. 5,903,554.

In an embodiment, the PDFs are assumed to be Gaussian. The shape of a Gaussian PDF is uniquely defined for a given mean and standard deviation. PDF 512 can be determined from the mean and standard deviation for good and bad frames, and PDF 510 can be determined from the mean and standard deviation for empty frames. Based on these PDFs, the threshold value $x_{TH}$, can be selected such that the desired outcome is achieved, as described above.

For zero rate detection, the computed metric for a particular frame is compared against the threshold value $x_{TH}$. If the computed metric is less than the threshold value $x_{TH}$ the frame is identified as a zero rate or empty frame. Otherwise, if the computed metric is greater than the threshold value $x_{TH}$, the frame is identified as a bad or erased frame. It should be noted that a different selection criterion is used if the quality metric is the computed distance between received and decoded frames.

The threshold value $x_{TH}$ can be adjusted to account for additional information available to the receiver. For example, since PDF 512 for hypothesis $H_1$ is initially determined from frames known to be good, and that good frames tend to contain more energy than erased frames, the average $x_1$ will be slightly higher than the true mean value for hypothesis $H_1$. Thus, the threshold value $x_{TH}$ can be slightly skewed or offset to the left of $x_1$. Viewed differently, since the computed metric is known to be from an empty frame (i.e., no transmission) or a bad frame (having low received energy, which is possibly the reason the frame is decoded as an erasure), it is likely to be a smaller value and the threshold value should be offset to the left accordingly. The amount of offset can be determined based on system simulation, empirical measurements, or by other means. For example, lab measurement can be made on a number of transmitted frames. The (mean) difference in the computed metrics between good and bad frames can then be determined and stored as a parameter in the receiving device. Subsequently, the computed mean for good frames can be offset by this mean difference to derive an estimate of the mean for bad frames. The threshold value can then be set based on the estimated mean for bad frames and the estimated mean for empty frames.

The threshold value can also be adjusted based on other available information, such as power control information. The transmit power of the transmitting source may be adjusted by a power control loop to provide a particular level of performance (e.g., a particular frame-error-rate FER) at the receiving device. In one implementation, the power control loop measures the quality (e.g., the Eb/Nt) of the received signal, compares the measured signal quality against a set point, and adjusts the transmit power of the transmitting source such that the signal quality is maintained at the set point. The set point is adjusted such that the desire performance is achieved. In this implementation, the threshold value can be adjusted, for example, by the difference between the set points for good and bad frames. For example, if the set point is 5 dB when a frame is correctly decoded and 4 dB when a frame is incorrectly decoded, the threshold value can be adjusted downward by 1 dB.

The threshold value can also be adjusted based on a decision feedback decoding scheme. Initially, the threshold value can be set to a particular value based on information then available, such as the initial estimated statistics for empty frames and bad frames. Thereafter, decoding is performed iteratively whereby information from incorrectly decoded frames is used to update the statistics for PDFs 510 and 512. For example, a frame incorrectly decoded can be estimated as either an empty frame or a bad frame, and the compute metric for this frame is used to update the statistics for PDF 510 or 512, respectively. In this manner, the decoded data is used in decoding future data (e.g., via the adjustment of the threshold value).

By setting the threshold value $x_{TH}$ based on measurements computed at the receiver, the operating conditions of the particular receiver are taken into consideration in making the zero rate determination. For example, if the receiver requires more power to maintain a particular level of performance, this fact will be taken into account in setting the threshold value.

The threshold value can also be dynamically adjusted as operating conditions change. The computed statistics (e.g., mean and standard deviation) can be determined based on a weighted average of the computed metrics. Numerous weighting schemes can be implemented. For example, the metrics can be weighted equally, weighted more heavily toward more recent measurements (i.e., a "leaky" average), or weighted using other schemes (e.g., frames located near good frames may be weighted more heavily).

Various other factors can also be used in setting the threshold value. For example, the set points for frames correctly and incorrectly decoded can also be used to adjust the threshold value. The set points can be averaged in the manners described above. The amount of adjustment in the threshold value can also be dependent on, for example, the number of fingers in a rake receiver used to demodulate the signal.

For clarity, the invention has been described for detecting zero rate frames on the forward link. For some CDMA systems (e.g., IS-95-B), on the reverse link, the code symbols at lower rates are transmitted at full power but pseudo-randomly transmitted in one of N possible symbol locations. For example, for eighth rate transmission, each code symbol is transmitted in one of eight possible symbol locations, with the location being selected by a long PN sequence. At the base station receiver, a selector unit selects the code symbols at the proper locations based on the hypothesized rate. Thus, the base station decoder for the lower rates includes a selector in place of the symbol accumulator. The decoder for the reverse link signal in an IS-2000 CDMA system is further described in the aforementioned IS-2000 submission.

For clarity, many aspects of the invention are described for a specific implementation in a CDMA system that complies with IS-2000. However, the invention can be adopted for used with other CDMA systems. One specific CDMA system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS" and U.S. Pat. No. 5,103,459, entitled "SYSTEM AND METHOD FOR GENERATING WAVEFORMS IN A CDMA CELLULAR TELEPHONE SYSTEM." Another specific CDMA system is described in U.S. patent application Ser. No. 08/963,386, entitled "METHOD AND APPARATUS FOR HIGH RATE PACKET DATA TRANSMISSION," filed Nov. 3, 1997. These patents and patent applications are assigned to the assignee of the present invention and incorporated herein by reference.

CDMA systems can be designed to conform to a number of currently defined CDMA standards, and current or future proposed standards. For example, the CDMA system can be designed to conform to "TIA/EIA/IS-95-A Mobile Station-Base Station Compatibility Standard for Dual-Mode Wideband Spread Spectrum Cellular System" or TIA/EIA/IS-98-A, -B, and -C entitled "Recommended Minimum Performance Standard for Dual-Mode Spread Spectrum Cellular and PCS Mobile Stations," hereinafter referred to as the IS-95-A and IS-98 standards, respectively. CDMA systems can also be designed to conform to the IS-2000 or the WCDMA standards being proposed by the standards bodies ETSI and ARIB. These various CDMA standards are incorporated herein by reference.

The invention can also be adopted for use with other types of communications systems such as time division multiple access (TDMA), frequency division multiple access (FDMA), and amplitude modulation (AM) schemes such as amplitude companded single sideband (ACSSB).

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for identifying zero rate frames in a received data transmission, the method comprising:
   receiving a modulated signal;
   demodulating the modulated signal in accordance with a particular demodulation format to generate demodulated symbols;
   partitioning the demodulated symbols into a plurality of received frames;
   computing a quality metric for each of the plurality of received frames;
   comparing the quality metric for a particular received frame against a threshold value, wherein the threshold value is selected based, in part, on the quality metrics of received frames; and
   identifying the particular received frame as being a zero rate frame or not a zero rate frame based on the comparing.

2. The method of claim 1, wherein the quality metric relates to an energy of a received frame.

3. The method of claim 2, wherein the quality metric for each received frame is computed as a sum of squared symbols for the received frame.

4. The method of claim 1, wherein the quality metric relates to a distance between a received frame and a codeword corresponding to the received frame.

5. The method of claim 4, further comprising:
   decoding each received frame into a decoded frame; and
   re-encoding the decoded frame in accordance with an encoding format to generate the codeword for the decoded frame.

6. The method of claim 4, further comprising:
   decoding each received frame into a decoded frame, and wherein the codeword comprises the decoded frame.

7. The method of claim 1, further comprising:
   decoding each received frame in accordance with a particular decoding hypothesis to generate a decoded frame.

8. The method of claim 7, wherein the particular decoding hypothesis includes a particular frame format and a particular rate selected from among a set of possible frame formats and rates.

9. The method of claim 8, wherein the set of possible frame formats includes 5 msec and 20·L msec frames, where L is an integer one or greater.

10. The method of claim 8, wherein the set of possible rates includes full, half, quarter, and eight rates.

11. The method of claim 7, wherein the threshold value is selected based, in part, on the quality metrics of decoded frames identified as good frames.

12. The method of claim 11, further comprising:
checking CRC bits associated with a decoded frame to identify whether the decoded frame is a good frame.

13. The method of claim 7, wherein the particular received frame is decoded and identified as not being a good frame.

14. The method of claim 1, wherein the threshold value is selected based, in part, on statistics of the quality metrics of received frames.

15. The method of claim 14, wherein the quality metrics of received frames are weighted equally to generate the statistics.

16. The method of claim 14, wherein the quality metrics of received frames are weighted unequally to generate the statistics.

17. The method of claim 1, wherein the threshold value is dynamically adjustable.

18. The method of claim 1, further comprising:
denormalizing the demodulated symbols with an energy of a pilot signal transmitted with the data transmission.

19. The method of claim 1, wherein the demodulation format is specified by IS-2000 or IS-95-A standard.

20. A receiver subsystem in a communications system comprising:
a demodulator configured to receive and demodulate a modulated signal in accordance with a particular demodulation format to generate demodulated symbols; and
a data processor operatively coupled to the demodulator, the data processor configured to
partition the demodulated symbols into a plurality of received frames,
compute a quality metric for each of the plurality of received frames,
compare the quality metric for a particular received frame against a threshold value, wherein the threshold value is selected based, in part, on the quality metrics of received frames, and
identify the particular received frame as being a zero rate frame or not a zero rate frame based on the comparison.

21. The receiver subsystem of claim 20, wherein the data processor includes:
a symbol accumulation circuit configured to receive and accumulate the demodulated symbols.

22. The receiver subsystem of claim 20, wherein the data processor includes:
a decoder configured to receive and decode the plurality of received frames to generate a plurality of decoded frames.

23. The receiver subsystem of claim 22, wherein the data processor further includes:
a CRC circuit coupled to the decoder, the CRC circuit configured to receive and check the plurality of decoded frames to identify good frames among the decoded frames.

24. The receiver subsystem of claim 22, wherein the data processor further includes:
an encoder coupled to the decoder, the encoder configured to receive and re-encode the decoded frames.

25. The receiver subsystem of claim 20, wherein the quality metric relates to an energy for a received frame.

26. The receiver subsystem of claim 25, wherein the quality metric for a received frame is computed as a sum of squared symbols for the received frame.

27. The receiver subsystem of claim 20, wherein the quality metric relates to a distance between the received frame and a codeword corresponding to the received frame.

28. In a CDMA communications system, a receiver subsystem operable to identify zero rate frames in a received data transmission, the receiver subsystem comprising:
a demodulator configured to receive and demodulate a modulated signal in accordance with a particular demodulation format to generate demodulated symbols;
a decoder operatively coupled to the demodulator, the decoder configured to receive the demodulated symbols as a plurality of received frames, and to decode the plurality of received frames into a plurality of decoded frames;
a CRC circuit coupled to the decoder, the CRC circuit configured to receive and check the plurality of decoded frames to identify good frames among the decoded frames; and
a metric calculation unit operatively coupled to the demodulator or the decoder, the metric calculation unit configured to
compute a quality metric for each of the plurality of received frames,
compare the quality metric for a particular received frame against a threshold value, wherein the threshold value is selected based, in part, on the quality metrics of received frames, and
identify the particular received frame as being a zero rate frame or not a zero rate frame based on the comparison.

* * * * *